United States Patent [19]

Oikawa et al.

[11] Patent Number: 4,713,494
[45] Date of Patent: Dec. 15, 1987

[54] MULTILAYER CERAMIC CIRCUIT BOARD

[75] Inventors: Shoji Oikawa, Yokohama; Hiroshi Yamagishi, Tokyo; Shigeru Saito, Yokohama; Tsuyoshi Fujita, Yokohama; Takayoshi Watanabe, Yokohama, all of Japan

[73] Assignee: Hitachi, Ltd., Tokyo, Japan

[21] Appl. No.: 851,729

[22] Filed: Apr. 14, 1986

[30] Foreign Application Priority Data

Apr. 12, 1985 [JP] Japan .................. 60-76574

[51] Int. Cl.⁴ ............................................. H05K 1/00
[52] U.S. Cl. .................... 174/68.5; 361/414
[58] Field of Search .......... 174/68.5; 361/414

[56] References Cited

U.S. PATENT DOCUMENTS

| 3,725,743 | 4/1973 | Murayama | 174/68.5 |
| 3,778,530 | 12/1973 | Reimann | 174/68.5 |
| 3,838,204 | 9/1974 | Ahn et al. | 174/68.5 |
| 4,075,416 | 2/1978 | Kuttner et al. | 174/68.5 |
| 4,311,768 | 1/1982 | Berdan et al. | 174/68.5 |
| 4,529,835 | 7/1985 | Mizuno | 174/68.5 |
| 4,541,035 | 9/1985 | Carlson et al. | 174/68.5 X |
| 4,549,043 | 10/1985 | Kalubowila et al. | 174/68.5 X |
| 4,594,473 | 6/1986 | Inoue et al. | 174/68.5 |

FOREIGN PATENT DOCUMENTS 59-36948 2/1984 Japan .

Primary Examiner—Morris H. Nimmo
Attorney, Agent, or Firm—Antonelli, Terry & Wands

[57] ABSTRACT

A multilayer ceramic circuit board and method of forming such circuit board are disclosed. The wiring pattern for the multilayer ceramic circuit board includes multiple-layer portions, the multiple-layer portions including first and second electrically conductive layers, respectively a tungsten layer and a copper thick film, for example, with a diffusion layer therebetween for improving adhesivity of the first and second electrically conductive layers to each other. Such multiple-layer portions are provided by providing first and second electrically conductive layers, and an intermediate layer between the first and second electrically conductive layers, and diffusing at least one component from the intermediate layer into both the first and second electrically conductive layers. Thus, a multilayer ceramic circuit board with, e.g., a firmly coupled tungsten layer and copper thick film can be provided.

17 Claims, 8 Drawing Figures

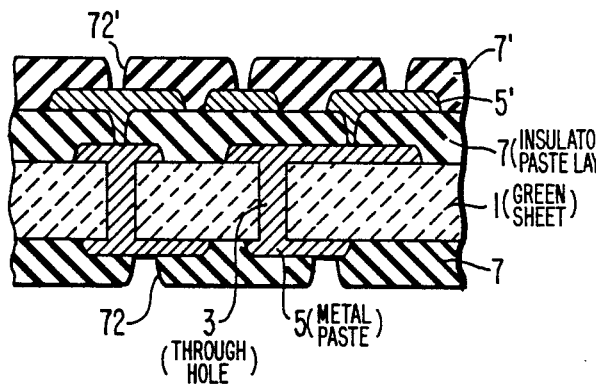
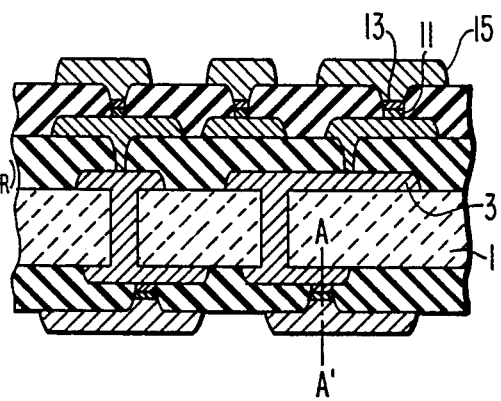
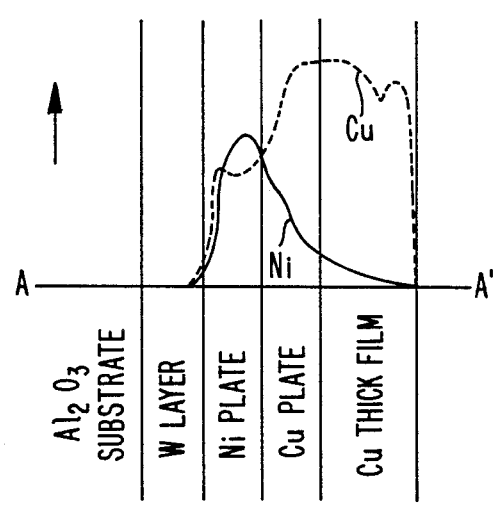
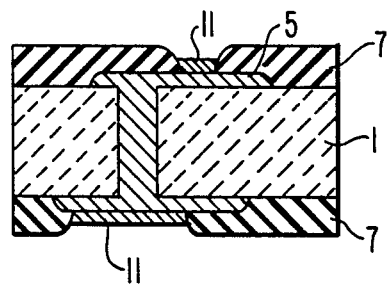
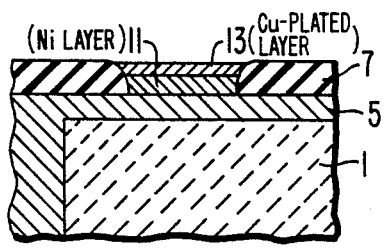
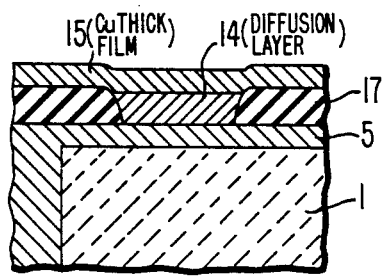
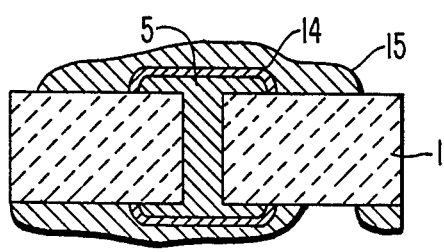

MULTILAYER CERAMIC CIRCUIT BOARD

BACKGROUND OF THE INVENTION

This invention relates to multilayer circuit boards, and, more particularly, to multilayer ceramic circuit boards (that is, multilayer circuits formed using ceramic sheets (boards)) and a method for their manufacture.

An example of multilayer ceramic circuit boards is shown in U.S. Pat. No. 3,838,204. In this U.S. patent, an alumina material can be used as the ceramic material, with a conducting pattern formed of a first conductor material, of a refractory metal such as molybdenum (Mo), for instance, and a second conductor material, of copper (Cu), for instance. The conducting pattern of the multilayer circuit boards in U.S. Pat. No. 3,838,204 is formed by forming conductor patterns, using the refractory metal, on a plurality of green sheets of the ceramic and in through holes of such green sheets; laminating the green sheets; and heating the laminated green sheets to sinter them and cause the metal of the conductor patterns to form capillary paths in the patterns; and then placing the sintered structure in contact with a molten, high conductivity metal to allow the metal to enter the capillary paths and fill them, thereby forming the desired high conductivity circuit structure.

When forming the conducting patterns of two layers of conducting material in forming multilayer ceramic circuit boards, for example, a refractory metal layer of tungsten (W) and a highly conducting material layer such as copper (Cu) can be used. However, since adhesion between the W layer and the Cu layer is not so strong, there sometimes occurs peeling between the two different conductor layers. Therefore one problem of such multilayer ceramic circuits with two such conductor layers, directly contacted with each other, is that, due to such peeling, reliability thereof cannot be guaranteed.

SUMMARY OF THE INVENTION

It is an object of this invention to provide ceramic circuit boards, e.g., multilayer ceramic circuit boards, using ceramic bases, having at least two conductor layers one on another, with the conductor layers being firmly coupled to each other.

It is another object of this invention to provide a method for producing ceramic circuit boards, e.g., multilayer ceramic circuit boards, having at least two conductor layers firmly coupled with each other.

It is another object of this invention to provide multilayer ceramic circuit boards, and a method of forming such circuit boards, having at least two conductor layers one on another, with one of conductor layers being of a refractory metal and the other being of a highly conducting metal, and with the conductor layers being firmly coupled to each other.

It is another object of this invention to provide multilayer ceramic circuit boards, and a method of forming such circuit boards, having a plurality of levels of wiring patterns, connected via through holes in insulating layers separating the levels of wiring patterns, wehrein the uppermost, exposed wiring pattern includes at least two conductor layers one on another, with one of the conductor layers being of a refractory metal such as tungsten and the other being of a highly conducting metal such as copper, and with the conductor layers being firmly coupled to each other.

In accordance with the aforementioned objects, this invention provides a diffusion layer means between a first electrically conductive layer means and a second electrically conductive layer means, for firmly connecting the first and second electrically conductive layers means together.

Also, this invention provides a method including the steps of providing a first conductive layer on at least one side of a ceramic circuit board (base), providing an intermediate layer on said first conductive layer, providing a second conductive layer on said intermediate layer, and diffusing at least one component (e.g., chemical element) of said intermediate layer into said first and second conductive layers to increase adhesion therebetween, and the product formed by this method.

Thus, the intermediate layer, by the diffusion layer of at least one component thereof (to thereby form the diffusion layer means) to provide at least one component thereof in both the first conductive layer and the second conductive layer, acts in effect to provide an adhesive layer to increase adherence of the second conductive layer means (that is, the layer resulting after diffusion of the at least one component of the intermediate layer into the second conductive layer, providing a layer having a predominance of material of the second conductive layer, but also some of the diffused component) to the first conductive layer means (that is, the layer resulting after diffusion of the at least one component of the intermediate layer into the first conductive layer, providing a layer having a predominance of material of the first conductive layer, but also some of the diffused component).

The intermediate layer can be a single layer, or can be composed of a plurality of layers, and preferably is electrically conducting. For example, the intermediate layer can be the combination of a layer of nickel, plated on the first conductor layer, and a layer of copper, plated on the nickel. Moreover, the intermediate layer can be a single layer of a mixture of components, such as a single layer of a mixture of nickel and copper.

As can be appreciated from the foregoing, the basic requirement of the intermediate layer is to provide at least one diffusing component into the first and second conductive layers to increase adhesion therebetween, while not substantially adversely effecting, e.g., the electrical conductance of the second conductive layer. For example, diffusion of, e.g., nickel of the intermediate layer into the copper of the second conductive layer increases the resistance of the second conductive layer; thus, while diffused nickel from the intermediate layer increases adhesivity of the second conductive layer to the first conductor layer, it is desirable to limit the diffusion of nickel into the second conductor layer so as to limit the increase in resistivity of the second conductive layer. In this regard, it is preferred that the nickel does not diffuse through the entire thickness of the second conductive layer to the surface of the second conductive layer not interfacing with the intermediate layer.

Preferably, the intermediate layer includes both nickel and copper as the components thereof, although copper by itself is available as the intermediate layer. A disadvantageous effect of using copper by itself for the intermediate layer is that a copper-plated layer, as the intermediate layer, is porous, so that moisture can be incorporated therein. The moisture can form ions which can corrode the interface between, e.g., the copper and tungsten of the first conductive layer. Such problem is avoided by using nickel in combination with the copper for the intermediate layer.

Preferably, the second conductive layer is of copper; and the first conductive layer is formed of a material selected from the group consisting of Mo, W, and Mo-Mn. For example, a laminate of first conductive layer of, e.g., tungsten, intermediate layer, and second conductive layer of, e.g., copper can be baked in a nitrogen atmosphere, to diffuse at least one component of the intermediate layer, without any oxidation of, e.g., copper as the second conductive layer.

BRIEF DESCRIPTION OF THE DRAWINGS

FIGS. 2 and 3 are sectional views of a multilayer ceramic circuit board in different intermediate stages according to manufacturing steps shown in FIG. 1.

FIG. 4 shows a distribution of diffusing components of the intermediate layer along the thickness direction of a wiring pattern manufactured by the method shown in FIG. 1.

FIGS. 5 and 8 show sectional views, during the manufacturing steps, of examples of the multilayer ceramic circuit board.

FIGS. 6 and 7 show sectional views of different intermediate stages of the manufacturing steps shown in FIGS. 1, for a portion of the circuit board formed in one embodiment.

DETAILED DESCRIPTION OF PREFERRED EMBODIMENTS

Figure 1:
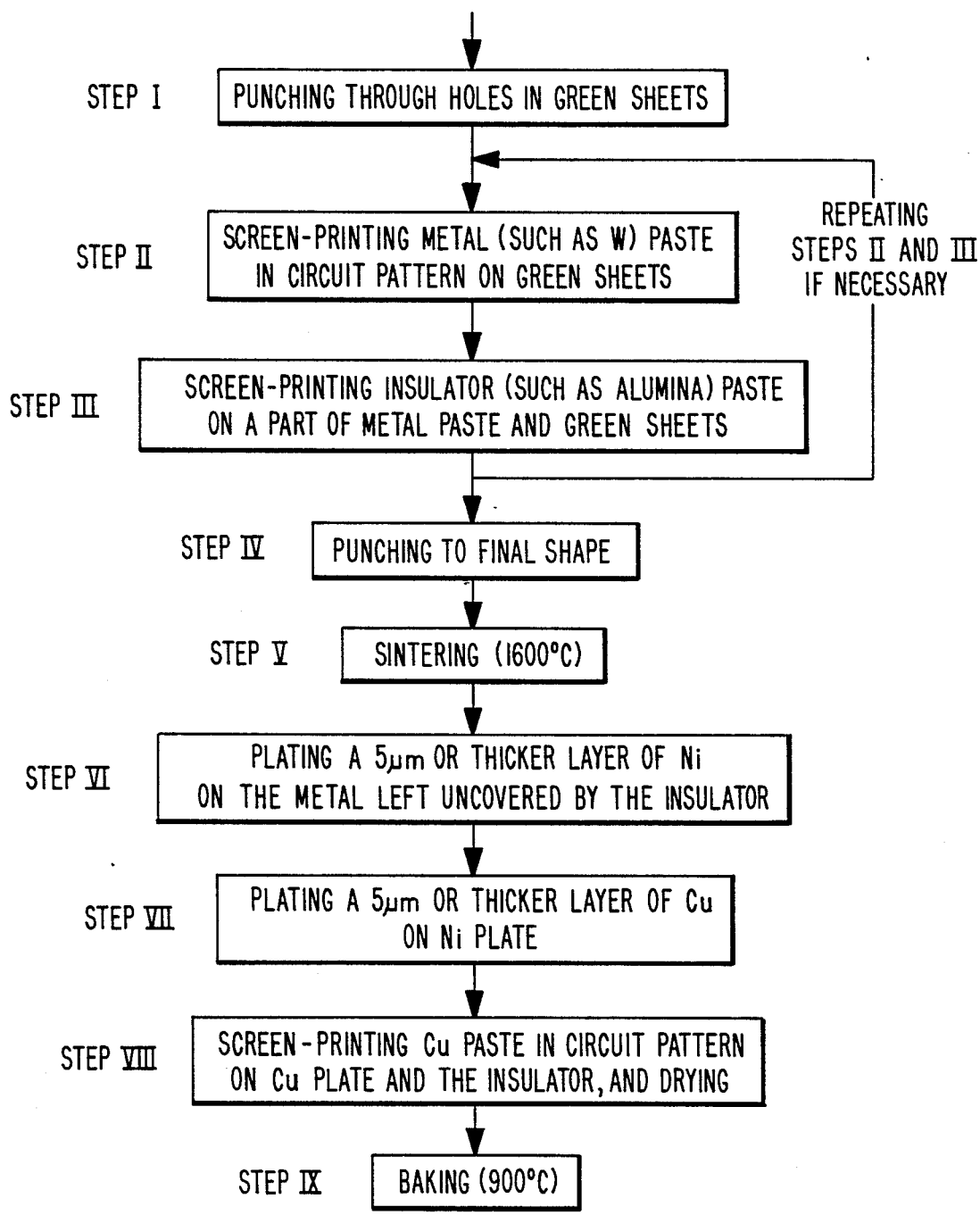
FIG. 1 is a flow chart showing an embodiment of a method in accordance with the present invention.

A first embodiment of the present invention will be discussed. Referring to FIGS. 1, 2 and 3, steps I, II, IV and V (set forth in FIG. 1) are well known, as shown in aforementioned U.S. Pat. No. 3,838,204. Step I includes punching through hole 3 in green sheet 1, such green sheet being a preliminary structure for forming the ceramic base sheet; in step II, the through hole 3 is filled with metal (for example, is filled with one of Mo, Mo-Mn and W) in the form of a metal paste 5. In this step II, the metal paste is also screen-printed on the green sheet 1 in a predetermined pattern, for providing a conductor layer. In step III, there is provided an insulator (such as, for instance, alumina) paste layer 7 on metal paste 5 and on the portion of green sheet 1 not covered with metal paste 5, the layer of the insulator paste 7 being formed by a conventional screen-printing method. This insulator paste layer 7, after sintering of the structure in step V, forms an insulator layer separating the various levels of wiring patterns of the multilayer circuit board.

In a multilayer ceramic circuit board as shown in FIG. 2, steps II and III are repeated once on the upper side of green sheet 1 to form metal paste 5' and insulator paste 7'. As can be appreciated, steps II and III can be repeated a plurality of times, on each side of the green sheet, to provide the desired number of levels of wiring patterns.

The board shown in FIG. 2 is punched to a final shape in step IV, and sintered in step V to form the insulator layers and ceramic board, and to form the metal layers of the multilevel wiring pattern, as is known in the art.

Further referring to FIGS. 1, 2 and 3, in step VI, after the sintering, there is provided a nickel (Ni) layer 11, whose thickness is 5 μm or more, on exposed surfaces of layers 5 (below green sheet 1 in FIG. 2) and 5' (above green sheet 1 in FIG. 2), surrounded by walls 72 and 72'; such nickel layer can be provided, e.g., by nickel plating. As examples of such nickel plating, the nickel layer can be formed by electroplating and electroless plating, as known in the art. Electroless plating, including plating from a Nickel-Phosphorus (Ni-P) electroless plating bath and from a Nickel-Boron (Ni-B) electroless plating bath, is preferable from a industrial manufacturing viewpoint, but electroplating may be suitable if the multilayer ceramic board has a complex structure or shape. Since the plating rate in such Ni-P plating bath is 2-5 times faster than that in such Ni-B plating bath, Ni-P plating is preferable.

However, since the melting point of a Ni layer produced by Ni-P plating is about 900° C., Ni-P plating is available only when the baking temperature in step IX is, for instance, 600° C., sufficiently lower than the melting point of the Ni layer so as to prevent Ni from being melted in step IX. In this regard, it is noted that a copper thick film, used as the second conductor layer, is baked in step IX at 600°-1100° C. Thus, a Ni layer produced from a Ni-P electroless plating bath can only be used where a baking temperature of less than 900° C. is used in step IX.

In step VII, Cu plating is provided by a conventional method to form Cu-plated layer 13; the thickness of the Cu-plated layer 13 is preferably double that of the Ni-plated layer provided in step VI.

Between steps VII and VIII, there may be provided an annealing heat treatment at a temperature of 500°-1000° C., for 5-10 minutes. In this annealing heat treatment, a neutral atmosphere such as $N_2$ gas or Ar gas; or a reducing atmosphere wherein an inert gas as mentioned above is mixed with $H_2$ gas of 5% of more, can be used. The reducing atmosphere is preferable to the neutral atmosphere, if a temperature for this annealing heat treatment is more than 600° C. The reducing atmosphere is preferable at high temperatures, for instance, at 900° C., because e.g., the Ni component of the intermediate layer, which is easily oxidized in the neutral atmosphere at such high temperature, may appear on the surface of the Cu-plated layer so as to cause a surface oxidation of the Cu-plated layer.

In step VIII, Cu paste is screen-printed by a conventional screening method to form Cu thick film 15, as the second conductor layer; then the multilayer ceramic circuit board shown in FIG. 3 is dried.

In step IX, the formed structure is baked at a temperature of 600°-1100° C., and $N_2$ gas is preferable as the atmosphere. By such baking, a diffusion layer is formed between the first conductive layer 5, 5', and Cu thick film 15. FIG. 4 shows distributions of Ni and Cu at A-A' section of FIG. 3, measured by a chemical element assay using an X-ray microanalyzer. That is, both the Ni and Cu components are diffused in both tungsten layers 5, 5' (first conductive layer) and Cu thick film 15 (second conductive layer) to operate as an adhesive means between the formed conductive layer means.

FIG. 5 shows the multilayer ceramic circuit board in the stage between steps VI and VII. Alumina is used as the material for green sheet 1, tungsten paste is used for first conductor layer 5, and alumina paste is used for insulator paste layer 7. The sintering in step V is performed in a reducing atmosphere at a temperature of 1600° C., for a period of 1-2 hours (preferably 1 hour), and electroless plating is used in step VI.

FIG. 6 shows an enlarged sectional view after the structure of FIG. 5 is provided with a Cu-plated layer, wherein electroless plating is used to deposit the Cu-plated layer. In this example, an annealing heat treatment with a reducing atmosphere of 700° C. for 10 minutes is performed between steps VII and VIII, to diffuse Ni and Cu within the Ni and Cu plated layers.

The Cu paste to form a Cu thick film 15 can be 9922 paste, produced by E. I. Dupont de Nemours & Co.; this paste, e.g., can be screen-printed onto the insulator layer formed from insulator paste layer 7, and the intermediate layer, as shown in FIG. 7. The Cu paste layer can have a thickness of 10–15 $\mu$m, preferably 10 $\mu$m. Step IX is then provided in an atmosphere of $N_2$ gas at a temperature of 900° C. for, e.g., 10–30 minutes (preferably, 10 minutes).

The adhesivity of the Cu thick film in the position above diffusion layer 14 and above insulator layer 7, respectively, is about 10 Kg/mm$^2$ and 4 Kg/mm$^2$. Thus, the improvement in adhesivity (that is, increased adhesivity) at the diffusion layer can clearly be seen.

In a second embodiment, Mo-Mn paste is used for the first conductor layer 5 and there is provided a sintering in step V, in a reducing atmosphere at a temperature of 1650° C. Such sintering is provided after performing step II, and without performing steps III and IV, of FIG. 1. In step VI there is provided an electroless Ni deposited from a Ni-P plating bath, such bath including sodium hypophosphite, to produce a Ni-plated layer whose thickness is about 3 $\mu$m. In this embodiment, there is provided between steps VI and VII an annealing heat treatment in an atmosphere of a mixed gas including 80% $N_2$ gas and 20% $H_2$ gas, at a temperature of 700° C., to stabilize the Ni-plated layer to adhere to the first conductor layer. There is provided a Cu-plated layer by electroplating, using a copper plating liquid including copper sulfate, to produce in step VII a Cu-plated layer whose thickness is 15 $\mu$m. A copper paste is used in step VIII that is able to be baked at 600° C., and the baking is performed in an atmosphere of $N_2$ gas.

FIG. 8 shows a sectional view of the multilayer ceramic circuit board in accordance with this embodiment. An adhesivity of more than 1 Kg/mm$^2$ is measured at every point on the Cu thick film.

While we have shown and described several embodiments in accordance with the present invention, it is understood that the same is not limited thereto but is susceptible of numerous changes and modifications as known to one having ordinary skill in the art and we therefore do not wish to be limited to the details shown and described herein, but intend to cover all such modifications as are encompassed by the scope of the appended claims.

What is claimed is:

1. A multilayer ceramic circuit board comprising:
   (a) a ceramic base means having opposed sides;
   (b) a first electrically conductive layer means, of a material selected from the group consisting of Mo, W and Mo-Mn, on at least one side of said ceramic base means; and
   (c) a second electrically conductive layer means on said first electrically conductive layer means, said second electrically conductive layer means including Cu; and wherein said board further includes
   (d) diffusion layer means, between said first electrically conductive layer means and said second electrically conductive layer means, and acting as an adhesive means between the first and second electrically conductive layer means, wherein said diffusion layer means comprising Cu, the first and second electrically conductive layer means each also including Cu from the diffusion layer means that has diffused into both of the first and second electrically conductive layer means.

2. A multilayer ceramic circuit board according to claim 1, further including at least one insulator layer on at least one side of the ceramic base means, with an electrically conductive material layer interposed between the ceramic base means and the at least one insulator layer, at one side of the insulator layer; and wherein the at least one insulator layer has at least one aperture therethrough for electrically connecting said electrically conductive material layer at the one side of the insulator layer with a further electrically conductive material layer at the opposing side of the insulator layer, the second electrically conductive layer means being in electrical connection with said electrically conductive material layer through said diffusion layer means and said first electrically conductive layer.

3. A multilayer ceramic circuit board according to claim 2, including a plurality of insulator layers, with an electrically conductive material layer interposed between adjacent ones of said plurality of insulator layers, the plurality of insulator layers each having at least one aperture therethrough for electrically connecting the electrically conductive material layer at one side of an insulator layer with a further electrically conductive material layer on the opposing side of the same insulator layer.

4. A multilayer ceramic circuit board according to claim 3, wherein said second electrically conductive layer means is located on the exposed side of the outermost of said plurality of insulator layers from the ceramic base means; wherein said diffusion layer means extends through an aperture of the outermost insulator layer; and wherein said first electrically conductive layer means forms at least a part of the electrically conductive material layer at the side of the outermost insulator layer opposite to the exposed side thereof.

5. A multilayer ceramic circuit board according to claim 2, wherein said second electrically conductive layer means is located on the exposed side of the insulator layer; wherein the diffusion layer means extends through at least one aperture in the insulator layer; and wherein said first electrically conductive layer means forms at least part of the electrically conductive material layer interposed between the ceramic base and the at least one insulator layer.

6. A multilayer ceramic circuit board according to claim 1, wherein the ceramic base means has first electrically conductive layer means formed at both sides thereof, the ceramic base means having apertures therethrough for electrically connecting the first electrically conductive layer means at both sides of the ceramic base means.

7. A multilayer ceramic circuit board comprising:
   (a) a ceramic base means having opposed sides;
   (b) a first electrically conductive layer means, of a material selected from the group consisting of Mo, W and Mo-Mn, on at least one side of said ceramic base means; and
   (c) a second electrically conductive layer means on said first electrically conductive layer means, said second electrically conductive layer means including Cu; and wherein said board further includes
   (d) diffusion layer means, between said first electrically conductive layer means and said second electrically conductive layer means, and acting as an adhesive means between the first and second electrically conductive layer means, wherein said diffusion layer means comprising Cu, the first and second electrically conductive layer means each also including at least one component of the diffusion layer means that has diffused into both of the first and second electrically conductive layer means.

8. A multilayer ceramic circuit board according to claim 7, further including at least one insulator layer on at least one side of the ceramic base means, with an electrically conductive material layer interposed between the ceramic base means and the at least one insulator layer, at one side of the insulator layer; and wherein the at least one insulator layer has at least one aperture therethrough for electrically connecting said electrically conductive material layer at the one side of the insulator layer with a further electrically conductive material layer at the opposing side of the insulator layer, the second electrically conductive layer means being in electrical connection with said electrically conductive material layer through said diffusion layer means and said first electrically conductive layer.

9. A multilayer ceramic circuit board according to claim 8, including a plurality of insulator layers, with an electrically conductive material layer interposed between adjacent ones of said plurality of insulator layers, the plurality of insulator layers each having at least one aperture therethrough for electrically connecting the electrically conductive material layer at one side of an insulator layer with a further electrically conductive material layer on the opposite side of the same insulator layer.

10. A multilayer ceramic circuit board according to claim 9, wherein said second electrically conductive layer means is located on the exposed side of the outermost of said plurality of insulator layers from the ceramic base means; wherein said diffusion layer means extends through an aperture of the outermost insulator layer; and wherein said first electrically conductive layer means forms at least a part of the electrically conductive material layer at the side of the outermost insulator layer opposite to the exposed side thereof.

11. A multilayer ceramic circuit board according to claim 8, wherein said second electrically conductive layer means is located on the exposed side of the insulator layer; wherein the diffusion layer means extends through at least one aperture in the insulator layer; and wherein said first electrically conductive layer means forms at least part of the electrically conductive material layer interposed between the ceramic base and the at least one insulator layer.

12. A multilayer ceramic circuit board according to claim 7, wherein the ceramic base means has first electrically conductive layer means formed at both sides thereof, the ceramic base means having apertures therethrough for electrically connecting the first electrically conductive layer means at both sides of the ceramic base means.

13. A multilayer circuit board comprising:
an insulating substrate;
a first layer on at least one side of said insulating substrate, said first layer comprising a material selected from the group consisting of Mo, W and Mo-Mn; and
a second layer on said first layer, said second layer comprising Cu and Ni.

14. A multilayer circuit board according to claim 13, wherein said first layer includes a sublayer comprising said material and at least one of Cu and Ni of said second layer diffused in said sublayer.

15. A multilayer circuit board according to claim 13, further comprising a diffusion layer between the first and second layers, said diffusion layer including material of the first and second layers, the diffusion layer providing increased adhesivity between the first and second layers as compared to the adhesivity therebetween when the first and second layers directly contact each other.

16. A multilayer circuit board according to claim 13, wherein said material is selected from the group consisting of Mo and Mo-Mn.

17. A multilayer circuit board according to claim 13, further comprising another layer, of Cu, on the side of the second layer not adjacent the first layer.

* * * * *